United States Patent
Kasugai

(10) Patent No.: US 8,035,380 B2
(45) Date of Patent: Oct. 11, 2011

(54) MAGNETIC RESONANCE IMAGING APPARATUS AND IMAGE DATA GENERATING METHOD

(75) Inventor: Takao Kasugai, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 547 days.

(21) Appl. No.: 12/068,277

(22) Filed: Feb. 5, 2008

(65) Prior Publication Data

US 2008/0186025 A1     Aug. 7, 2008

(30) Foreign Application Priority Data

Feb. 6, 2007  (JP) ................................. 2007-026967
Jan. 22, 2008  (JP) ................................. 2008-011837

(51) Int. Cl.
*G01V 3/00* (2006.01)

(52) U.S. Cl. ........................................................ 324/309

(58) Field of Classification Search .......... 324/300–322; 600/410–435
See application file for complete search history.

(56) References Cited

U.S. PATENT DOCUMENTS

| | | | | |
|---|---|---|---|---|
| 4,770,182 A | * | 9/1988 | Damadian et al. | 600/410 |
| 6,486,667 B1 | * | 11/2002 | Wu et al. | 324/306 |
| 7,542,791 B2 | * | 6/2009 | Mire et al. | 600/407 |
| 7,612,562 B2 | * | 11/2009 | Yasuhara | 324/318 |

FOREIGN PATENT DOCUMENTS

JP     2003-175016     6/2003

* cited by examiner

*Primary Examiner* — Melissa Koval
*Assistant Examiner* — Dixomara Vargas
(74) *Attorney, Agent, or Firm* — Nixon & Vanderhye PC

(57) ABSTRACT

Some of plural coil elements or the sections which have received magnetic resonance image signals associated with first image data are determined to be target coil elements or target coil sections. Second image data is generated by combining a plurality of pieces of first image data respectively associated with the target elements or sections. A display unit displays an image represented by the second image data. The target elements or sections are then changed based on specification after display of the second image data and third image data is generated by combining the plurality of pieces of first image data associated with the changed target elements sections.

17 Claims, 9 Drawing Sheets

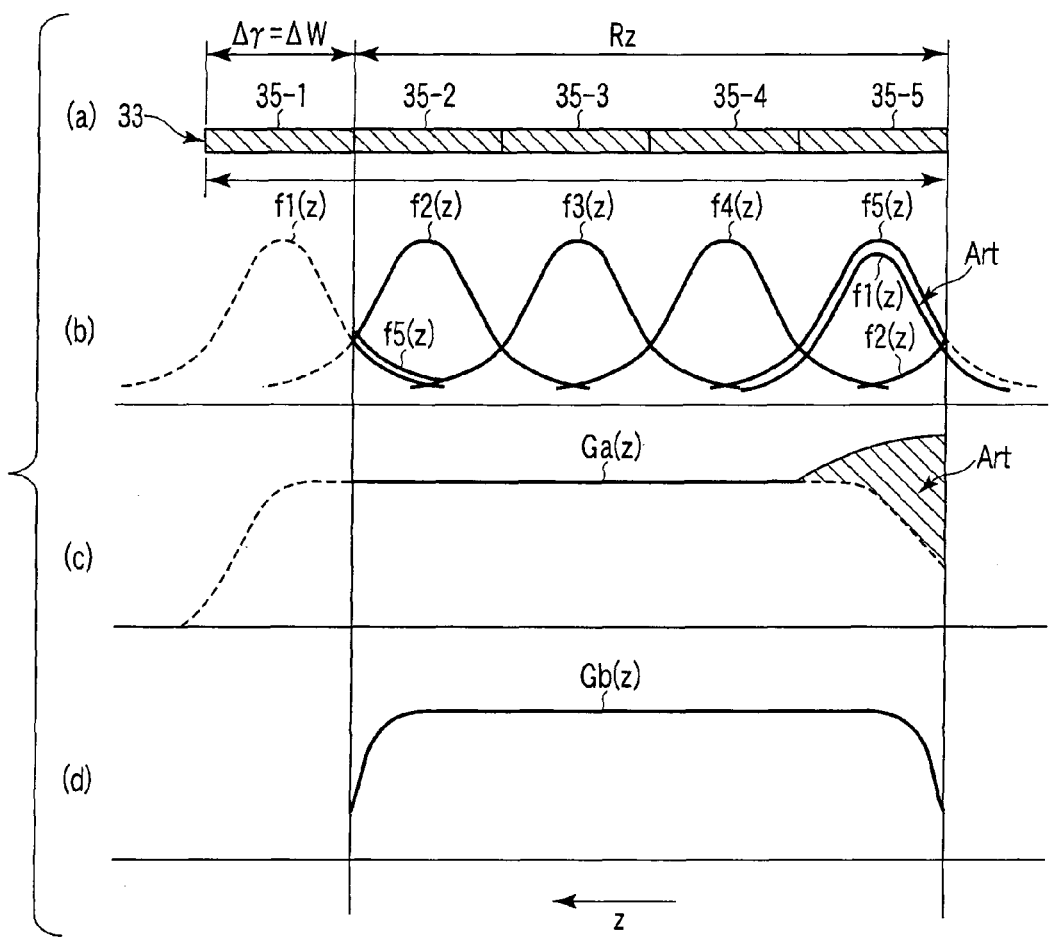
F I G. 5

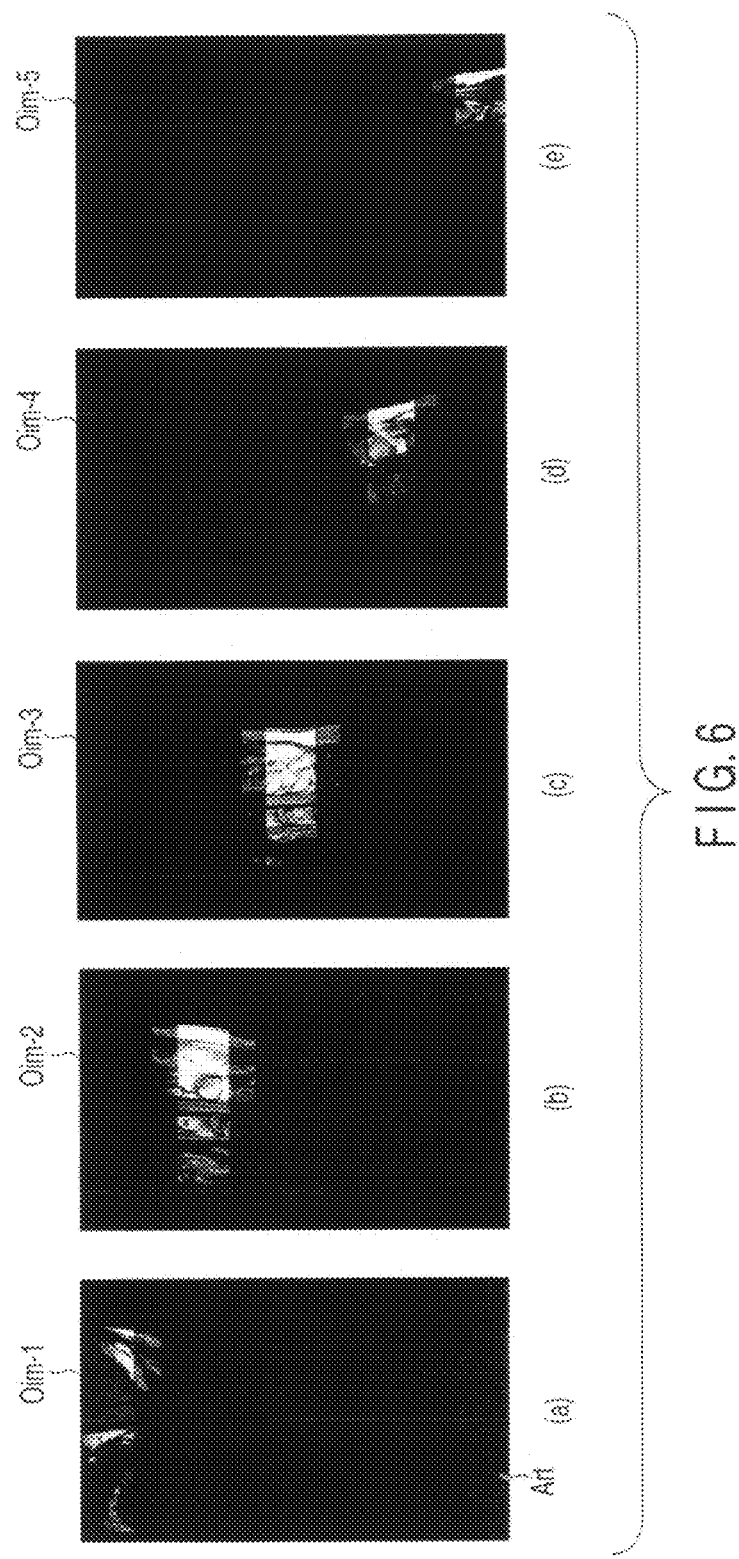
F I G. 6

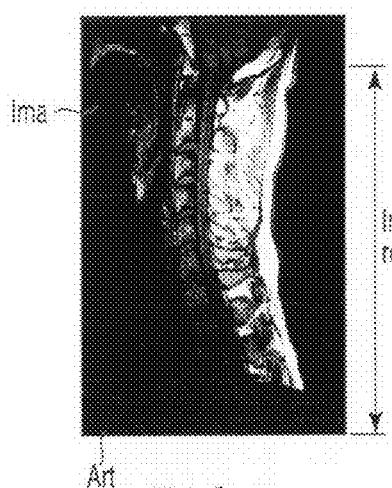 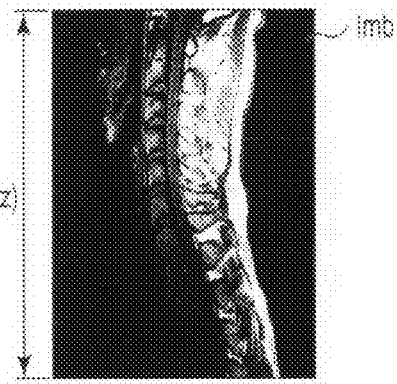
FIG.7  FIG.8
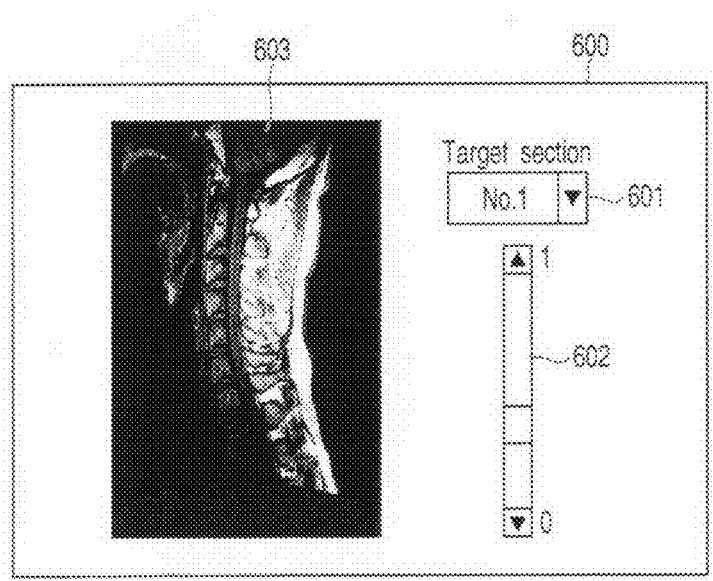
FIG.10

MAGNETIC RESONANCE IMAGING APPARATUS AND IMAGE DATA GENERATING METHOD

CROSS-REFERENCE TO RELATED APPLICATIONS

This application is based upon and claims the benefit of priority from prior Japanese Patent Applications No. 2007-026967, filed Feb. 6, 2007; and No. 2008-011837, filed Jan. 22, 2008, the entire contents of both of which are incorporated herein by reference.

BACKGROUND OF THE INVENTION

1. Field of the Invention

The present invention relates to a magnetic resonance imaging (MRI) apparatus and image data generating method which enable generation of high-sensitivity image data by using an array coil.

2. Description of the Related Art

According to a magnetic resonance imaging (MRI) method, the spin of an atomic nucleus in a subject tissue placed in a static magnetic field is excited by using a radio-frequency signal (RF pulse) having a Larmor frequency associated with the atomic nucleus. Further, image data is reconstructed from a magnetic resonance (MR) signal generated with this excitation.

The MRI apparatus is a diagnostic imaging apparatus that utilizes the MRI method to generate image data of, e.g., the inside of a living body. Since the MRI apparatus can obtain many pieces of diagnostic information, e.g., not only anatomical diagnostic information but also biochemical information or diagnostic function information, this apparatus is important in the field of diagnostic imaging today.

In recent years, MRI using an array coil has been extensively carried out for the purpose of collecting image data with respect to an imaging region in a wide range with a high sensitivity. The array coil is constituted by two-dimensionally aligning a plurality of reception coils (which will be referred to as coil elements hereinafter). In MRI using the MRI array coil, MR signals detected by a plurality of coil elements adjacent to each other are added and combined with each other so that the plurality of coil elements are equivalently bundled in a plurality of sections. Furthermore, reconfiguring MR signals obtained from the respective sections enables generating a plurality of pieces of image data (referred to as original image data hereinafter). Moreover, combining the plurality of pieces of original image data enables the generation of image data used in diagnosis (referred to as diagnostic image data hereinafter) (see, e.g., JP-A 2003-175016 [KOKAI]).

FIG. 13 is a view showing an example of a positional relationship between a subject and an array coil 51.

The array coil 51 has three sections 52-1, 52-2, and 52-3. The array coil 51 is arranged in such a manner that an alignment direction of the sections 52-1 to 52-3 matches with a body axis direction of a subject.

FIG. 14 includes views showing three original images 53-1, 53-2, and 53-3 obtained by using the array coil 51. The original images 53-1 to 53-3 are obtained by respectively reconfiguring MR signals detected by coil elements belonging to the sections 52-1 to 52-3. The original image 53-1 has a maximum sensitivity in a region of the subject facing the coil element in the section 52-1. The original image 53-2 has a maximum sensitivity in a region of the subject facing the coil element in the section 52-2. Additionally, the original image 53-3 has a maximum sensitivity in a region of the subject facing the coil element in the section 52-3.

FIG. 15 is a view showing a diagnostic image 54 obtained by combining the original images 53-1 to 53-3 depicted in FIG. 14.

In MRI using the array coil, a coil element associated with an imaging region must be selected from a plurality of coil elements in the array coil arranged near a subject to form each of the above-explained sections. In particular, when imaging, e.g., a cervical spine or a spinal column, a diagnosis target region of the subject must be arranged above the array coil disposed on a top panel, and hence selecting a preferable coil element for an imaging region of this diagnosis target region is very difficult.

For example, when a coil element arranged outside the imaging region is erroneously selected, this coil element detects an MR signal having a high frequency component that does not satisfy a sampling theorem. In this case, an artifact due to aliasing in reconfiguration of the MR signal is produced in diagnostic image data. On the other hand, when a coil element arranged in the imaging region is not selected, a sensitivity in a region of diagnostic image data associated with a position of this coil element is considerably degraded.

Further, when an artifact or sensitivity degradation that cannot be allowed is recognized in diagnostic image data collected by using a first selected coil element, MRI must be again performed starting from selection of a coil element. When a skill of an operator is low, such an operation must be repeated until desired diagnostic image data is obtained. Therefore, not only an efficiency of MRI is considerably lowered but also a burden on the operator may be increased.

BRIEF SUMMARY OF THE INVENTION

Under such circumstances, efficiently and easily obtaining desired image data has been demanded.

According to a first aspect of the present invention, there is provided a magnetic resonance imaging apparatus comprising: a static magnetic field generating unit which generates a static magnetic field; a gradient magnetic field generating unit which generates a gradient magnetic field to be superposed on the static magnetic field; a transmitting unit which transmits a radio-frequency pulse with which a subject having the static magnetic field and the gradient magnetic field applied thereto is irradiated; a plurality of coil elements which respectively receive magnetic resonance signals from the subject; a collecting unit which collects the magnetic resonance signals respectively received by the plurality of coil elements or a plurality of sections formed by grouping the plurality of coil elements; a reconstructing unit which reconstructs a plurality of pieces of first image data associated with the coil elements or the sections that have received the magnetic resonance signals, by use of the plurality of magnetic resonance signals collected by the collecting unit; a first generating unit which determines the coil elements or the sections which have received the plurality of magnetic resonance signals which are at least some of the plurality of magnetic resonance signals collected by the collecting unit as target elements or target sections, and generates second image data by combining the plurality of pieces of first image data associated with the target elements or the target sections; a display unit which displays an image represented by the second image data; and a second generating unit which changes the target elements or the target sections based on specification of a change in the target elements or the target section in accordance with the specification after display of the second image by the display unit, and generates third image data by combining the plurality of pieces of first image data associated with the changed target elements or the changed target sections.

According to a second aspect of the present invention, there is provided a magnetic resonance imaging apparatus comprising: a static magnetic field generating unit which generates a static magnetic field; a gradient magnetic field generating unit which generates a gradient magnetic field to be superposed on the static magnetic field; a transmitting unit which transmits a radio-frequency pulse with which a subject having the static magnetic field and the gradient magnetic field applied thereto is irradiated; a plurality of coil elements which respectively receive magnetic resonance signals generated from the subject; a collecting unit which collects the magnetic resonance signals respectively received by the plurality of coil elements or a plurality of sections formed by grouping the plurality of coil elements; a reconstructing unit which reconstructs a plurality of pieces of first image data respectively associated with the coil elements or the sections that have received the magnetic resonance signals, by use of the plurality of magnetic resonance signals collected by the collecting unit; a first generating unit which generates second image data by combining a plurality of pieces of combination target data as at least some of the plurality of pieces of first image data to generate second image data; a display unit which displays an image represented by the second image data; and a second generating unit which generates third image data by combining the first image data specified in accordance with specification of the first image data including an artifact from the combination target data after display of the image by the display unit with the plurality of pieces of combination target data while differentiating weighting of the plurality of pieces of combination target data excluding the specified pieces of first image data to reduce an influence of the artifact.

According to a third aspect of the present invention, there is provided an image data generating method comprising: generating a static magnetic field; generating a gradient magnetic field to be superposed on the static magnetic field; transmitting a radio-frequency pulse with which a subject having the static magnetic field and the gradient magnetic field applied thereto is irradiated; respectively receiving magnetic resonance signals generated from the subject by a plurality of coil elements; collecting the magnetic resonance signals respectively received by the plurality of coil elements or a plurality of sections formed by grouping the plurality of coil elements; reconstructing a plurality of pieces of first image data associated with the coil elements or the sections that have received the magnetic resonance signals, by use of the plurality of collected magnetic resonance signals; determining the coil elements or the sections having received a plurality of magnetic resonance signals that are at least some of the plurality of collected magnetic resonance signals as target elements or target sections, and generates second image data by combining the plurality of pieces of first image data associated with the target elements or the target sections; displaying an image represented by the second image data; and changing the target elements or the target sections in accordance with specification of changing the target elements or the target sections when the specification is carried out after displaying the second image, and generates third image data by combining the plurality of pieces of first image data associated with the changed target elements or the changed target sections.

According to a fourth aspect of the present invention, there is provided an image data generating method comprising: generating a static magnetic field; generating a gradient magnetic field to be superposed on the static magnetic field; transmitting a radio-frequency pulse with which a subject having the static magnetic field and the gradient magnetic field applied thereto is irradiated; respectively receiving magnetic resonance signals generated from the subject by a plurality of coil elements; collecting the magnetic resonance signals respectively received by the plurality of coil elements or a plurality of sections formed by grouping the plurality of coil elements; reconstructing a plurality of pieces of first image data associated with the coil elements or the sections that have received the magnetic resonance signals, by use of the plurality of collected magnetic resonance signals; generating second image data by combining a plurality of pieces of combination target data as at least some of the plurality of pieces of first image data to generate second image data; displaying an image represented by the second image data; and generating third image data by combining specified pieces of first image data in accordance with the specification of the first image data including an artifact from the combination target data after displaying the image with the plurality of pieces of combination target data while differentiating weighting of the plurality of pieces of combination target data excluding the specified pieces of first image data to reduce an influence of the artifact.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 5 is a view schematically showing sensitivity distributions of pieces of original image data associated with respective sections in FIG. 2 and a sensitivity distribution of diagnostic image data obtained by combining these pieces of original image data;

FIG. 6 includes views showing situations where an artifact occurs in the original image data;

FIG. 7 is a view showing diagnostic image data Ima in the form an image;

FIG. 8 is a view showing diagnostic image data Imb in the form of an image;

FIG. 10 is a view showing an example of a display image that enables an operator to set weighting coefficient;

DETAILED DESCRIPTION OF THE INVENTION

An embodiment according to the present invention will now be explained hereinafter with reference to the drawings.

In an MRI apparatus according to the embodiment explained below, an array coil in which a plurality of coil elements are two-dimensionally aligned is used to perform MRI. In the MRI apparatus, the coil elements two-dimensionally aligned in an imaging region of a subject preset based on, e.g., a scan plan are grouped to form a plurality of sections in a body axis direction. In the MRI apparatus, MR signals detected in the plurality of sections are reconstructed to generate respective pieces of original image data associated with the respective sections. Further, in the MRI apparatus, these pieces of original image data are combined to generate diagnostic image data. In the MRI apparatus, eliminating original image data including an unallowable artifact enables generating diagnostic image data having few artifacts.

It is to be noted that the coil elements-grouped into five sections are used to generate five pieces of original image data in a sagittal section (a vertical section as seen from the side) of a cervical spine of a subject in this embodiment. An explanation will be given as to an example where four pieces of original image data having few artifacts selected from these pieces of original image data are combined to generate diagnostic image data. It is to be noted that the number of pieces of original image data or an image cross section are not restricted, and they may be arbitrary. For example, an image cross section may be, e.g., a coronal section (a vertical section as seen from the front) or an axial (lateral) section.

(Structure of Apparatus)

Figure 1:
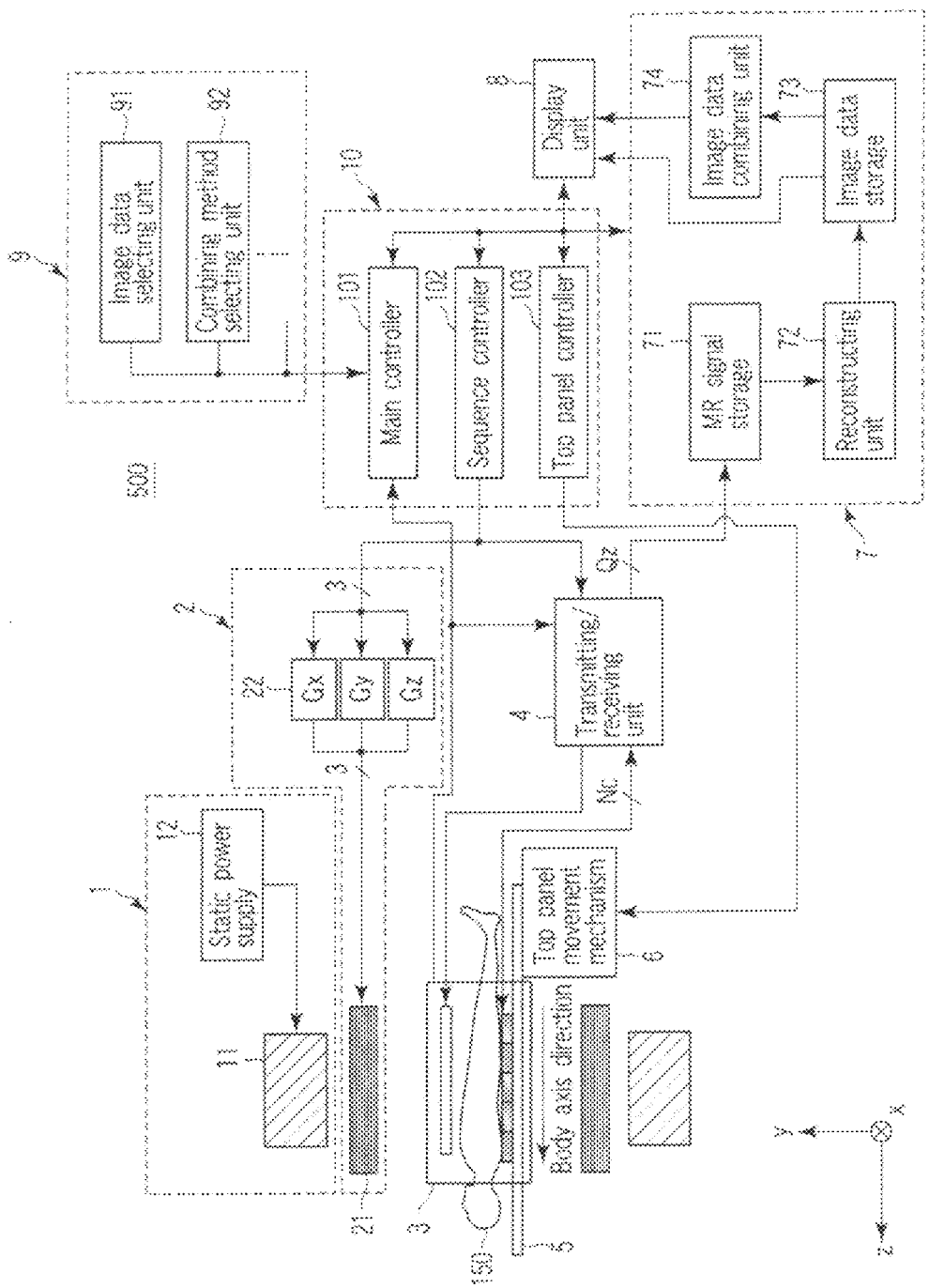
FIG. 1 is a block diagram showing an entire structure of an MRI apparatus according to an embodiment of the present invention.
Figure 2:
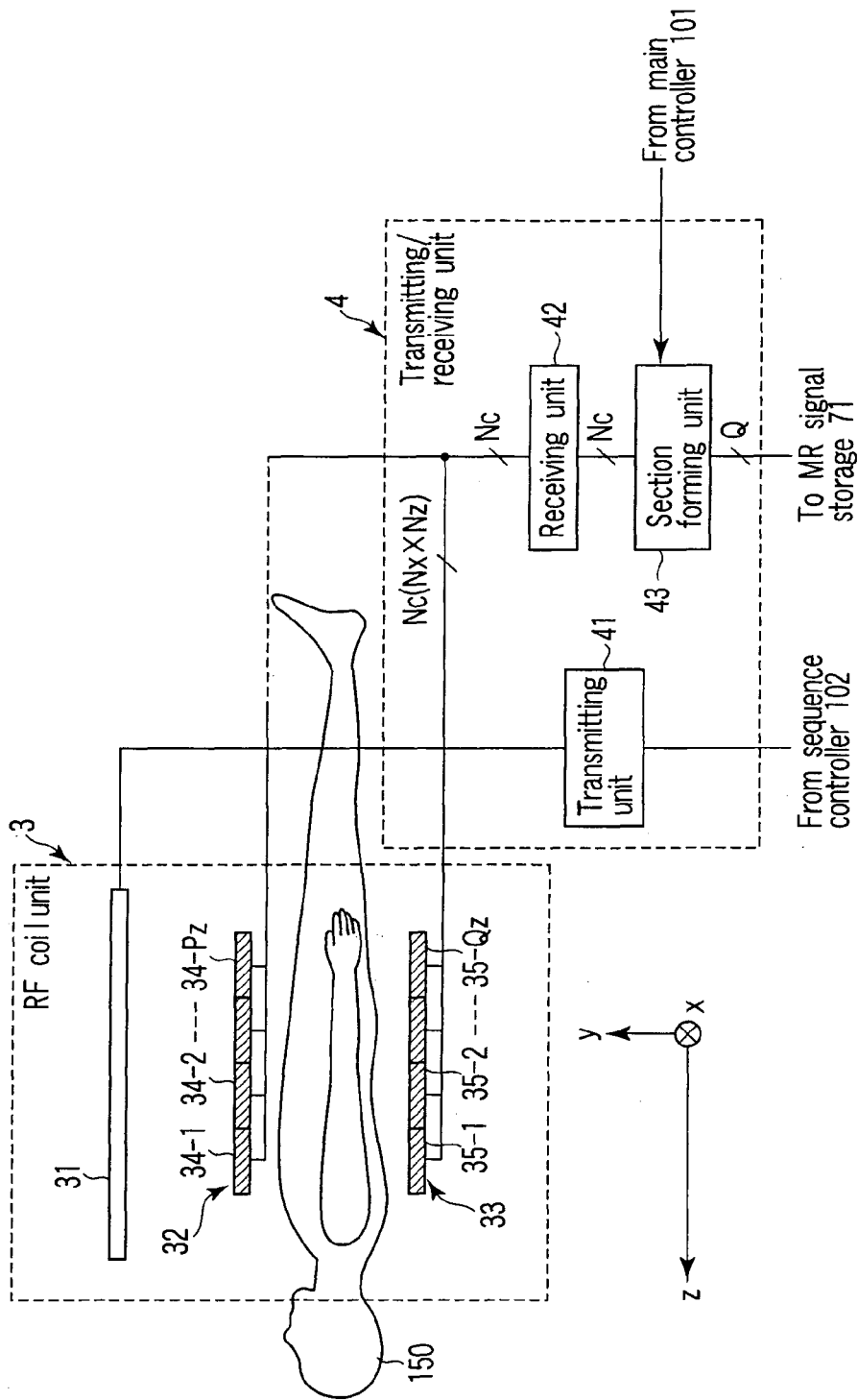
FIG. 2 is a view showing specific structures of an RF coil unit and a transmitting/receiving unit in FIG. 1.

A structure of an MRI apparatus 500 according to the embodiment will now be explained with reference to FIGS. 1 to 6. It is to be noted that FIG. 1 is a block diagram showing an entire structure of the MRI apparatus 500. FIG. 2 is a view showing specific structures of an RF coil unit 3 and a transmitting/receiving unit 4 provided in the MRI apparatus 500.

The MRI apparatus 500 includes a static magnetic field generating unit 1, a gradient magnetic field generating unit 2, the RF coil unit 3, the transmitting/receiving unit 4, a top panel 5, a top panel movement mechanism 6, an image data generating unit 7, a display unit 8, an input unit 9, and a control unit 10.

The static magnetic field generating unit 1 and the gradient magnetic field generating unit 2 generate magnetic fields with respect to a subject 150. The RF coil unit 3 irradiates the subject 150 with an RF pulse and detects an MR signal. The transmitting/receiving unit 4 supplies a pulse current to the RF coil unit 3, and performs predetermined signal processing with respect to an MR signal detected by the RF coil unit 3. The subject 150 is mounted on the top panel 150. The top panel movement mechanism 6 moves the top panel 5 in a body axis direction of the subject 150. The image data generating unit 7 generates original image data and diagnostic image data based on an MR signal received by the transmitting/receiving unit 4. The display unit 8 displays an original image or a diagnostic image represented by the generated original image data or diagnostic image data. The input unit 9 sets imaging conditions or image data display conditions, selects original image data, selects image data combining method, inputs various kinds of command signals, and performs others. The control unit 10 collectively controls the respective units in the MRI apparatus 500.

The static magnetic field generating unit 1 includes a main magnet 11 and a static power supply 12. The main magnet 11 is formed of a normal conducting magnet or a superconducting magnet. The static power supply 12 supplies a current to the main magnet 11. Further, the static magnetic field generating unit 1 forms an intensive static magnetic field around the subject 150 arranged in an imaging field at a central portion of a non-illustrated gantry. It is to be noted that the main magnet 11 may be formed of a permanent magnet.

The gradient magnetic field generating unit 2 includes a gradient coil unit 21 and a gradient power supply 22. The gradient coil unit 21 has three gradient coils. These three gradient coils form gradient magnetic fields along a body axis direction (z-direction) and x- and y-directions which are perpendicular to this body axis direction. The gradient coil unit 21 and the gradient power supply 22 supply pulse currents to the respective three gradient magnetic coils. The gradient coil unit 21 and the gradient power supply 22 add positional information to magnetic fields in an imaging field where the subject 150 is placed based on a sequence control signal supplied from the control unit 10. That is, the gradient power supply 22 controls pulse currents supplied to the gradient coils in the x-, y-, and z-directions based on the sequence control signal to form gradient magnetic fields with respect to the respective directions. Furthermore, the gradient magnetic fields in the x-, y-, and z-directions are combined so that a slice selecting gradient magnetic field Gs, a phase encoding gradient magnetic field Ge, and reading (frequency encoding) gradient magnetic field Gr which are perpendicular to each other are formed in desired directions. These gradient magnetic fields are superposed on a static magnetic field formed by the main magnet 11 to be applied to the subject 150.

As shown in FIG. 2, the RF coil unit 3 includes a transmission coil 31 and array coils 32 and 33. The transmission coil 33 is provided in the non-illustrated gantry of the MRI apparatus 500 together with the gradient coil unit 21. The array coils 32 and 33 are arranged on an abdominal side and a back side of the subject 150 to receive an MR signal. Moreover, in case of generating image data, when a pulse current having a predetermined frequency (Larmor frequency) and an envelope is supplied to the transmission coil 31, the transmission coil 31 irradiates the imaging region of the subject 150 with an RF pulse, and an MR signal generated in a tissue of the subject 150 by irradiation of this RF pulse is detected by the array coil 32 or the array coil 33 to be supplied to the transmitting/receiving unit 4.

It is to be noted that the array coil 32 is used to image an organ on the abdominal side of the subject 150. The array coil 33 is used to image, e.g., a cervical spine or a vertebra. Although an example where the array coil 33 on the back side alone is used to image the cervical spine of the subject 150 will be explained below, the present invention is not restricted thereto.

Figure 3:
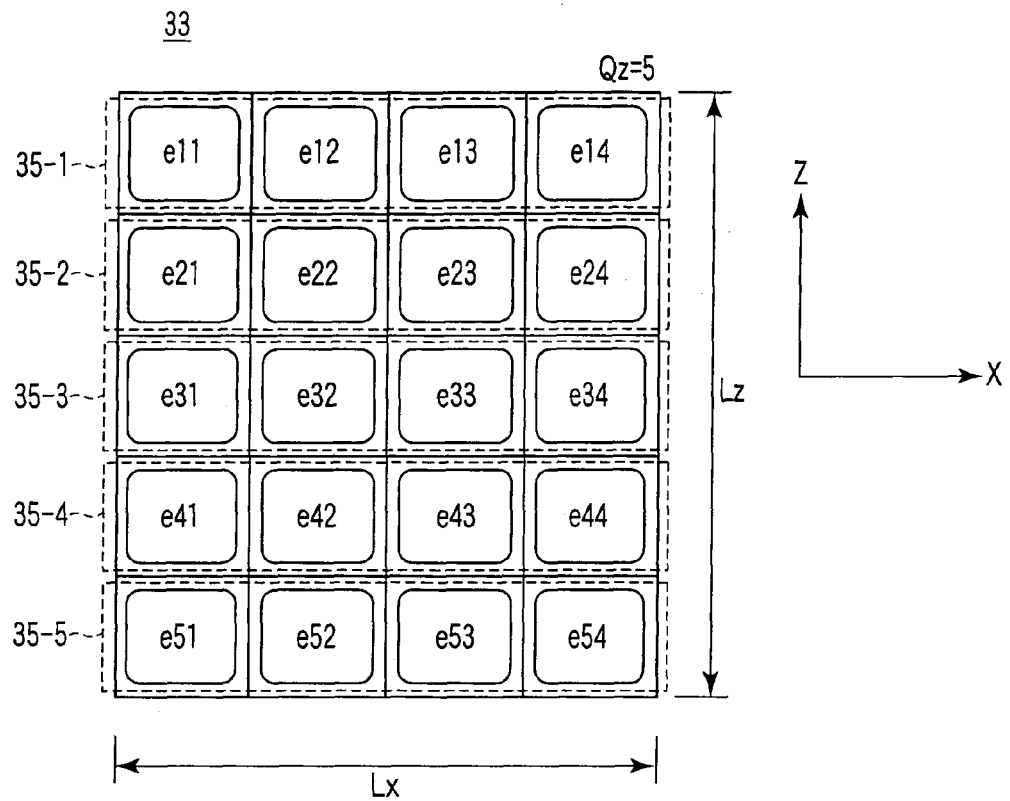
FIG. 3 is a view showing an example of an arrangement of coil elements included in an array coil in FIG. 2.

FIG. 3 is a view showing an example of an arrangement of coil elements included in the array coil 33. In the array coil 33 depicted in FIG. 3, a coil region width in the body axis direction (y-direction) is Lz, and a coil region width in the x-direction is Lx. In this array coil 33, Nx coil elements in the x-direction and Nz coil elements in the z-direction, i.e., a total of Nx×Nz coil elements are two-dimensionally aligned. In FIG. 3, Nx=4 and Nz=5, a total of 20 coil elements e11 to e14, e21 to e24, e31 to e34, e41 to e44, and e51 to e54 are aligned in a 4×5 matrix shape. Additionally, the Nx coil elements aligned in the x-direction are grouped by the transmitting/receiving unit 4, thereby equivalently forming Qz sections 35-1, 35-2, . . . , and 35-Q. In the example depicted in FIG. 3, Qz=Nz=5, and the five sections 35-1 to 35-5 are formed.

That is, the coil elements e11 to e14 form the section 35-1, the coil elements e21 to e24 form the section 35-2, the coil elements e31 to e34 form the section 35-3, the coil element e41 to e44 form the section 35-4, and the coil elements e51 to e54 form the section 35-5, respectively. Based on such grouping, the structure becomes equivalent to an example where the five coils are aligned in the body axis direction in the array coil 33.

Figure 4:
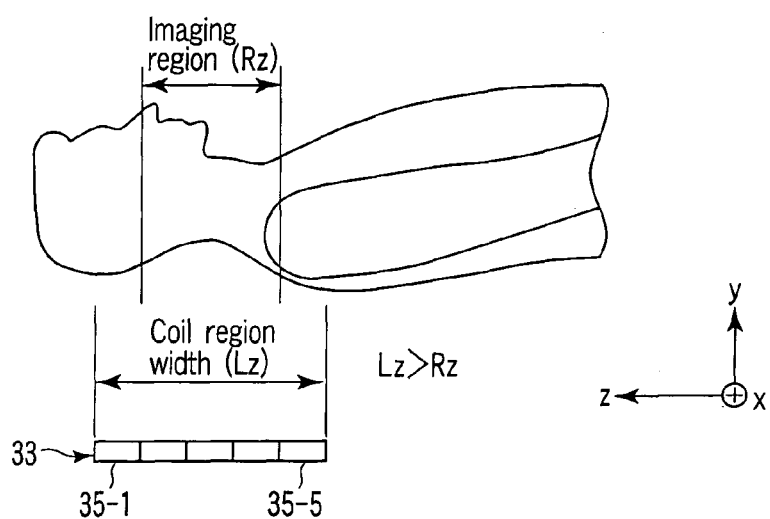
FIG. 4 is a view showing a positional relationship between an imaging region of a subject and the array coil in FIG. 2.

FIG. 4 is a view showing a positional relationship between the imaging region of the subject 150 and the array coil 33. The sections 35-1 to 35-5 in the array coil 33 are set in such a manner that the coil region width Lz in the z-axis direction becomes wider than an imaging region Rz of the subject 150 in the body axis direction.

As shown in FIG. 2, the transmitting/receiving unit 4 includes a transmitting unit 41, a receiving unit 42, and a section forming unit 43.

The transmitting unit 41 has a frequency that is substantially equal to a magnetic resonance frequency (the Larmor frequency) in a predetermined slice section determined based on a static magnetic field intensity of the main magnet 11 and a gradient magnetic field of the gradient coil unit 21, and generates a pulse current modulated with a predetermined selected excitation waveform to be supplied to the transmission coil 31.

The receiving unit 42 includes an intermediate frequency conversion circuit, a phase detection circuit, a low-frequency amplifier, a filtering circuit, and an analog-to-digital converter. The receiving unit 42 individually performs signal processing, e.g., intermediate frequency conversion, phase detection, low-frequency amplification, filtering, analog-to-digital conversion, and other operations on MR signals in Nc (Nc=Nx×Nz) channels respectively fed from the Nc (Nc=Nx×Nz) coil elements in the array coil 33.

The section forming unit 43 includes a switching circuit and an addition circuit. With respect to the sections 35-1 to 35-Qz, the section forming unit 43 adds and combines the MR signals in the Nx channels supplied from the Nx coil elements belonging to these sections, thereby equivalently forming the sections 35-1 to 35-Qz.

Meanwhile, as shown in FIG. 1, the top panel 5 is supported on an upper surface of a non-illustrated bed base portion to be slidable in the z-direction. The subject 150 is mounted on the top panel 5 in such a manner that its body axis direction becomes parallel to the z-direction. The top panel 5 moves in the z-direction to set an imaging target region of the subject 150 to a desired position in the imaging field.

The top panel movement mechanism 6 is disposed at, e.g., an end portion or a lower portion of the bed base portion. The top panel movement mechanism 6 generates a driving signal that is used to move the top panel 5 based on a top panel movement control signal supplied from the control unit 10. Additionally, the top panel movement mechanism 6 moves the top panel 5 in the z-direction at a predetermined speed based on this driving signal.

As shown in FIG. 1, the image data generating unit 7 includes an MR signal storage 71, a reconstructing unit 72, an image data storage 73, and an image data combining unit 74.

The MR signal storage 71 stores MR signals Mr-1 to Mr-Qz respectively detected by the sections 35-1 to 35-Qz of the array coil 33 in respective storage regions.

The reconstructing unit 72 sequentially reads the MR signals Mr-1 to Mr-Qz stored in the MR signal storage 71 and performs image reconfiguration based on two-dimensional Fourier transformation to generate respective pieces of original image data Oim-1 to Oim-Qz. That is, the reconstructing unit 72 reconstructs the MR signal Mr-1 detected by the section 35-1 to obtain the original image data Oim-1. Likewise, it reconstructs the MR signals Mr-2 to Mr-Qz detected by the sections 35-2 to 35-Qz to obtain the pieces of original image data Oim-2 to Oim-Qz.

The image data storage 73 stores the respective pieces of original image data Oim-1 to Oim-Qz obtained by the reconstructing unit 72.

The image data combining unit 74 selects all or part of the pieces of original image data Oim-1 to Oim-Qz stored in the image data storage 73 in accordance with a command from the control unit 10. The image data combining unit 74 combines these selected pieces of original image data in accordance with a combining method based on a preset arithmetic expression to obtain diagnostic image data.

MR Signal

The display unit 8 shown in FIG. 1 includes a display data generation circuit and, a conversion circuit, and a monitor. The display unit 8 displays a diagnostic image represented by the diagnostic image data generated by the image data combining unit 74. Specifically, the display data generation circuit adds collateral information, e.g., subject information supplied from the control unit 10 to the diagnostic image data fed from the image data combining unit 74 to generate display data. The conversion circuit converts this display data into a predetermined display format. The monitor displays an image according to the display format.

It is to be noted that the display unit 8 can also display the pieces of original image data Oim-1 to Oim-Qz stored in the mage data storage 73 by the same method. Displaying the pieces of original image data Oim-1 to Oim-Qz enables an operator to observe whether an artifact has occurred in each original image data, thereby facilitating a judgment on the original image data having an unallowable artifact.

The input unit 9 includes various kinds of input devices, e.g., switches arranged on an operation table, a keyboard, or a mouse, a display panel, and others. Further, the input unit 9 forms an interactive interface in cooperation with the display unit 8 through the control unit 10. The input unit 9 accepts an operation by an operator for, e.g., setting of imaging conditions including a pulse sequence and others, setting of image data display conditions, setting of sections, input of a top panel movement command, or input of various kinds of command signals. Moreover, the input unit 9 includes an image data selecting unit 91 and a combining method selecting unit 92.

The image data selecting unit 91 selects original image data to be combined when generating the diagnostic image data based on an operation by an operator.

The combining method selecting unit 92 selects an original image data combining method based on an operation by the operator.

The control unit 10 includes a main controller 101, a sequence controller 102, and a top panel movement controller 103.

The main controller 101 includes a CPU and a storage circuit. The main controller 101 controls the MRI apparatus 500. Subject information, imaging conditions for an MRI examination, display conditions for image data, selection information of original image data, selection information of an original image data combining method, and others is input, set or selected by the input unit 9 are stored in the storage circuit of the main controller 101. The CPU of the main controller 101 controls collection of MR signals and generation and generation and display of original image data and diagnostic image data based on various kinds of information stored in the storage circuit. It is to be noted that, when collecting the MR signals, the CPU sets an intensity, a supply time, a supply timing, and others of a pulse current supplied to the gradient coil unit 21 or the RF coil unit 3 based on a pulse sequence applied to imaging, and supplies pulse sequence information indicative of these settings to the sequence controller 102.

The sequence controller 102 includes a CPU and a storage circuit. The sequence controller 102 temporarily stores the pulse sequence information supplied from the main controller 101 in the storage circuit of the sequence controller 102. The sequence controller 102 generates a sequence control signal based on the pulse sequence information to control the gradient power supply 22 or the transmitting/receiving unit 4.

Additionally, the top panel movement controller 103 generates a top panel movement control signal based on a top panel movement control command supplied from the input unit 9 through the main controller 101, and supplies the generated signal to the top panel movement mechanism 6.

An operation of the thus configured MRI apparatus 500 will now be explained.

FIG. 5 is views schematically showing a sensitivity distribution of original image data associated with each of the sections 35-1 to 35-5 and a sensitivity distribution of diagnostic image data obtained by combining these pieces of original image data.

Here, as shown in (a) in FIG. 5, it is assumed that the center of the coil region width Lz formed of the sections 35-1 to 35-5 in the z-direction is Δγ/2 shifted toward the left-hand side with respect to the center of the imaging region Rz (Rz<Lz) in the z-direction. However, a shift amount Δγ/2 is set to ½ of a section width Δw to simplify the explanation.

(b) in FIG. 5 shows a sensitivity distribution of each of the pieces of original image data Oim-1 to Oim-5 obtained by the sections 35-1 to 35-5 in the z-direction. Specifically, sensitivity distributions f1(z) to f5(z) are respectively indicative of sensitivity distributions of the pieces of original image data Oim-1 to Oim-5 with respect to the z-direction. In this case, the section 35-1 is placed outside the imaging region Rz. Therefore, an unallowable radio-frequency component is included in the MR signal detected by the section 35-1. A part of the sensitivity distribution f1(z) of the original image data Oim-1 is represented as an artifact component Art at a right-end portion of the imaging region Rz due to this radio-frequency component.

(c) in FIG. 5 shows a sensitivity distribution Ga(z) of diagnostic image data Ima generated by equally combining all the pieces of original image data Oim-1 to Oim-5. As shown in (c) in FIG. 5, the artifact component Art also remains in the diagnostic image data Ima.

(d) in FIG. 5 shows a sensitivity distribution Gb(z) of diagnostic image data Imb generated by combining the pieces of original image data Oim-2 to Oim-5 in which artifact components can be ignored. Since the original image data Oim-1 including the artifact component Art is not combined, the artifact component Art shown in (c) in FIG. 5 is not included in the diagnostic image data Imb.

FIG. 6 consists of views showing situations of occurrence of an artifact in the original image data. Views (a) to (e) in FIG. 6 show the pieces of original image data Oim-1 to Oim-5 in the cervical spine of the subject 150 obtained by the sections 35-1 to 35-5 in the form of images. These pieces of original image data Oim-1 to Oim-5 have the maximum sensitivity at positions where the sections 35-1 to 35-5 are respectively arranged. Further, the artifact Art due to the cervical spine is shown at a lower-end portion of the original image data Oim-1 obtained by the section 35-1 arranged outside the imaging region.

FIG. 7 is a view showing the diagnostic image data Ima in the form of an image. FIG. 8 is a view showing the diagnostic image data Imb in the form of an image. As apparent from FIGS. 7 and 8, when original image data in which an unallowable artifact has occurred is prevented from being used to obtain diagnostic image data, diagnostic image data with few artifacts can be generated in the imaging region even if the imaging region Rz does not match with the coil region width Lz.

It is to be noted that the image data combining unit 74 combines pieces of original image data based on a preset arithmetic expression. For example, when combining the pieces of original image data Oim-2 to Oim-5 to generate the diagnostic image data Imb, assuming that sensitivity distributions of the pieces of original image data Oim-2 to Oim-5 are f2(z) to f5(z), a sensitivity distribution Gb(z) of the diagnostic image data Imb can be calculated based on the following Expression 1 or 2, for example. However, A2(z) to A5(z) and B2(z) to B5(z) denote preset weighting coefficients.

$$Gb(y) = \sqrt{A2(y)f2(y)^2 + A3(y)f3(y)^2 + A4(y)f4(y)^2 + A5(y)f5(y)^2} \quad (1)$$

$$Gb(y) = B2(y)f2(y) + B3(y)f3(y) + B4(y)f4(y) + B5(y)f5(y) \quad (2)$$

It is to be noted that Expression 1 represents an arithmetic operation (square-sum arithmetic operation) of calculating a square root of a square-sum of a sensitivity distribution fi(z) (i=2 to 5) of the original image data. Furthermore, Expression 2 represents an arithmetic operation (an adding arithmetic operation) of performing a usual addition with respect to the sensitivity distribution fi(z) (i=2 to 5).

(Diagnostic Image Data Generation Procedure)

A diagnostic image data generation procedure will now be explained with reference to a flowchart of FIG. 9.

Prior to imaging the subject 150, an operator of the MRI apparatus 500 selects the array coil 33 having the coil elements which are two-dimensionally aligned in a range wider than the imaging region of the subject 150, and arranges this array coil 33 at a predetermined position on the top panel 5. Then, the operator mounts the subject 150 on the top panel 5 in such a manner that the array coil 33 is placed near the imaging region of the subject 150 (step S1 in FIG. 9).

Subsequently, the operator inputs a top panel movement command from the input unit 9 to move the top panel 5 in the z-direction in such a manner that a diagnosis target region of the subject 150 is placed in an imaging field at the center of the gantry. Then, the operator performs input of subject information, setting of an imaging region, setting of imaging conditions and image data display conditions, selection of an original image data combining method, setting of sections, and others in the input unit 9. Furthermore, these input information, setting information, and selection information are stored in the storage circuit included in the main controller 101 (step S2 in FIG. 9).

Subsequently, the operator inputs an imaging start command in the input unit 9 (step S3 in FIG. 9). When this start command is supplied to the main controller 101, generation of the pieces of original image data Oim-1 to Oim-Qz using the sections 35-1 to 35-Qz in the array coil 33 is started under control of the main controller 101.

A description will now be given as to an example where T1 emphasized image data in a sagittal section of a cervical region of the subject 150 is generated as diagnostic image data by using a spin echo (SE) method.

When collecting the T1 emphasized image data by using the SE method, the gradient power supply 22 controls pulse currents for the respective gradient coils of the gradient coil unit 21 in the x-, y-, and z-directions based on the sequence control signal supplied from the sequence controller 102, and applies a slice selecting gradient magnetic field Gs which is used to set a sagittal section and a phase encoding gradient magnetic field Ge and a reading gradient magnetic field Gr which are used to encode a generation position of an MR signal obtained from this sagittal section to the diagnosis target region of the subject 150.

Furthermore, when generating, e.g., diagnostic image data having Na×Na pixels, application of the phase encoding gradient magnetic field Ge having Na types of magnetic field intensities is repeated for Na times in a repetition cycle TR, and application of the reading gradient magnetic field Gr having a predetermined magnetic field intensity is repeated for Na times in the repetition cycle TR.

Furthermore, when generating, e.g., diagnostic image data having Na×Na pixels application of the phase encoding gradient magnetic field Ge having Na types of magnetic field intensities is repeated for Na times in a repetition cycle TR, and application of the reading gradient magnetic field Ge having a predetermined magnetic field intensity is repeated for Na times in the repetition cycle TR.

On the other hand, the transmitting unit 41 in the transmitting/receiving unit 4 supplies a pulse current to the transmission coil 31 in such a manner that irradiating the imaging region of the subject 150 with a 90-degree RF pulse is repeated for Na times in the repetition cycle TR during application of the first slice selecting gradient magnetic field Gs and irradiating the same region with a 180-degree RF pulse is repeated for Na times in the repetition cycle TR during application of the second slice selecting gradient magnetic field Gs after a time period TE/2 from the former irradiation. Moreover, each of the Nc coil elements in the array coil 33 receives the MR signal generated from the subject 150 after the time period TE/2 from application of the 180-degree RF pulse and supplies this signal to the receiving unit 42. The receiving unit 42 performs predetermined processing with respect to these MR signals in Nc channels.

Subsequently, the section forming unit 43 adds and combines the MR signals supplied from the coil elements aligned in a direction (x-direction) perpendicular to the body axis direction of the subject 150 to form the sections 35-1 to 35-0. Moreover, the MR signals in Qz channels supplied from the sections 35-1 to 35-Qz are stored in the MR signal storage 71. That is, the MR signal storage 71 stores the MR signals Mr-1 to Mr-Qz in the Qz channels in accordance with the sections 35-1 to 35-Qz.

It is to be noted that each of the 90-degree RF pulse and the 180-degree RF pulse is an RF wave that is used to supply an energy required to turn an atomic nucleus spin of a subject tissue 90 degrees or 180 degrees to the atomic nucleus spin. A time TE is a time from irradiation of the 90-degree RF pulse to detection of the MR signal. A time TR is a detection cycle of the MR signal.

Figure 9:
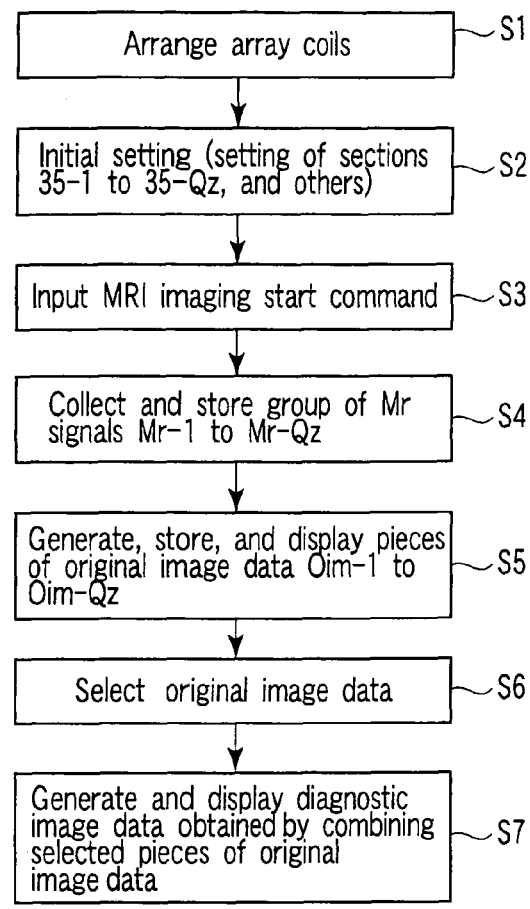
FIG. 9 is a flowchart showing a procedure of generating diagnostic image data.
Figure 13:
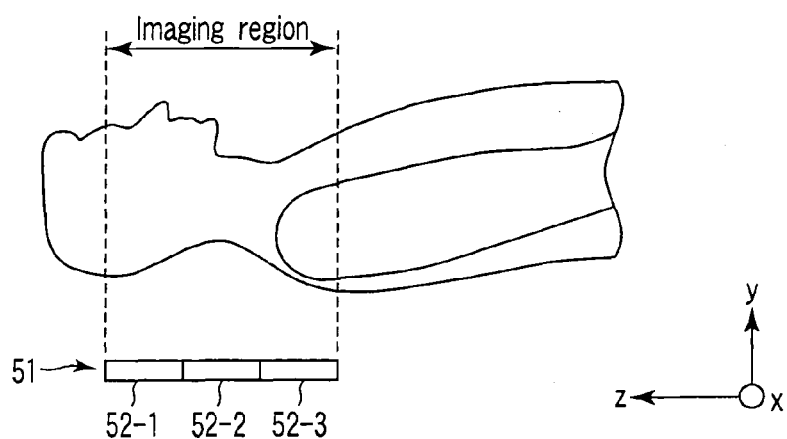
FIG. 13 is a view showing an example of a positional relationship between a subject and an array coil.

Then, the reconstructing unit 72 performs two-dimensional Fourier transformation of Na MR echoes respectively having Na data points in each of the MR signals Mr-1 to Mr-Qz to generate the pieces of original image data Oim-1 to Oim-Qz in the sagittal section having Na×Na pixels, stores the generated pieces of data in the image data storage 73, and displays them in the display unit 8 (step S5 in FIG. 9).

An operator who has observed the pieces of original image data Oim-1 to Oim-Qz displayed in the display unit 8 selects pieces of original image data having allowable artifacts from the pieces of original image data Oim-1 to Oim-Qz by using the image data selecting unit 91 (step S6 in FIG. 9).

Additionally, the image data combining unit 74 that has received an image data selection signal from the image data selecting unit 91 via the main controller 101 combines the pieces of original image data read from the image data storage 73 based on this image data selection signal to obtain diagnostic image data. The obtained diagnostic image data is displayed in the display unit 8 (step S7 in FIG. 9).

As explained above, according to this embodiment, all the sections 35-1 to 35-Qz are used to collect the MR signals. Further, the pieces of original data selected by the operator from the pieces of original image data Oim-1 to Oim-Qz respectively reconstructed from these MR signals are combined to obtain the diagnostic image data. Therefore, the diagnostic image data with few artifacts can be obtained without performing an operation of repeating imaging while changing the sections used for imaging. Furthermore, the operator can select the sections utilized for imaging while observing an actual situation of occurrence of artifacts, and a burden on the operator is reduced as compared with a case where sections are selected based on a positional relationship between the imaging region of the subject 150 and each section.

Moreover, according to this embodiment, since all the pieces of original image data whose artifacts are allowable are used for generation of the diagnostic image data, the diagnostic image data with small degradation in sensitivity can be obtained.

Additionally, when setting positions of the sections in the array coil suitable for the imaging region of the subject, since a high position accuracy is not required, not only a time required for an initial setting can be reduced but also a burden on the operator can be reduced.

(First Modification)

Displaying the respective pieces of original image data Oim-1 to Oim-Qz as images and allowing the operator to confirm this as explained above may not be preferable in a clinical site in some cases.

In such a case, the operator is allowed to confirm a situation of occurrence of artifacts when the diagnostic image data obtained by combining all the pieces of original image data Oim-1 to Oim-Qz is displayed as an image and all the sections are used. Further, specification of a section determined to be unused by the operator based on the diagnostic image data is input through the input unit 9. Furthermore, the image data combining unit 74 may combine pieces of original image data except original image data associated with the section determined to be unused to obtain new diagnostic image data.

In this case, specification of an unused section must be repeated until desired diagnostic image data is obtained in some situations, but processing repeated in this case is combining pieces of original image data, and collection of MR signals and other are not performed, thereby rapidly obtaining the new diagnostic image data. Moreover, when this operation is carried out, the operator does not have to confirm each of a plurality of images in order to confirm a situation of occurrence of artifacts, and confirming one image can suffice, thus reducing a burden on the operator concerning this operation.

(Second Modification)

In a case where some of the pieces of original image data Oim-1 to Oim-Qz are not used to be combined, this is equivalent to setting a weight to zero when combining these pieces of original image data.

Meanwhile, as can be understood from (a) in FIG. 6, even original image data in which an unallowable artifact has occurred may include information useful for a diagnosis (which will be referred to as diagnostic information hereinafter) in some cases. Thus, such original image data may be combined by using a weight lower than those of the other pieces of original image data. In this case, although a weighting coefficient may be fixed, allowing the operator to arbitrarily set the weighting coefficient is convenient.

FIG. 10 is a view showing an example of a display image 600 that allows the operator to set the weighting coefficient.

For example, this display image 600 is generated by the image data combining unit 74 under control of the main controller 101 and displayed in the display unit 8.

In the display image 600, a selection box 601, a slide bar 602, and diagnostic image display region 603 are arranged. The main controller 101 changes a number of a section displayed in the selection box 601 in response to an operation of the selection box 601 by the operator. Additionally, the main controller 101 sets a weighting coefficient of the original image data associated with the section having the number displayed in the selection box 601 as a change target. The main controller 101 changes the weighting coefficient of the original image data set as the change target based on an operation of the slide bar 602 by the operator. The main controller 101 allows the image data combining unit 74 to perform combination to which the changed weighting coefficient is applied every time the weighting coefficient is changed. Further, the main controller 101 updates the diagnostic image display region 603 to display diagnostic image data newly obtained by the image data combining unit 74 as an image.

When such an operation is carried out, even the original image data in which an unallowable artifact has occurred can be utilized so that the artifact does not greatly affect the diagnostic image data, thereby improving an image quality of the diagnostic image data.

(Third Modification)

In case of the second modification, when the weighting coefficient is increased to exploit the diagnostic information, an influence of the artifact also becomes large. Thus, some of regions where an artifact has occurred in one piece of original image data are eliminated, and then this original image data is used to be combined.

That is, the description has been given as to the case where the original image data Oim-i in which the artifact has occurred is eliminated and the remaining pieces of original image data Oim-2 to Oim-5 are combined to generate the diagnostic image data having few artifacts in the foregoing embodiment. However, in such a case, original image data obtained by eliminating (excising) an artifact occurrence region in the original image data Oim-1 may be combined with the remaining pieces of original image data Oim-2 to Oim-5 to generate diagnostic image data.

Figure 11:
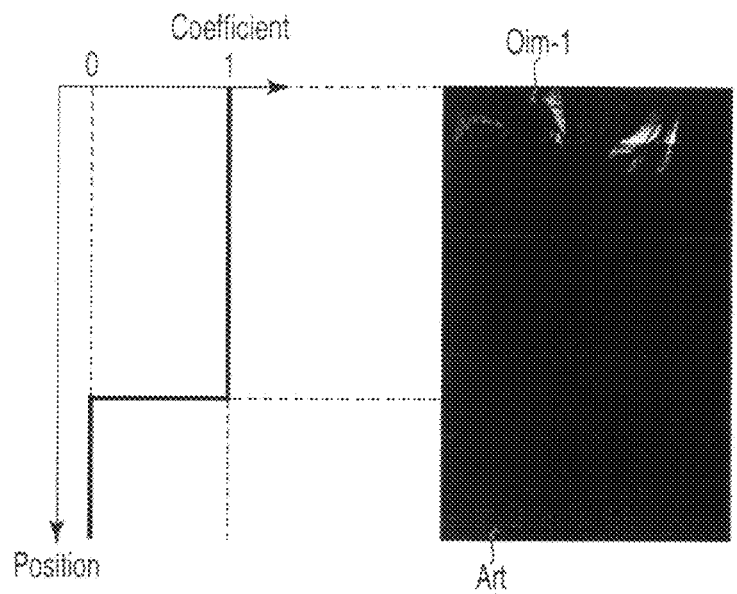
FIG. 11 is a view showing an example of setting a weighting coefficient that is used to perform combination in a state where a region where an artifact is produced is eliminated in one piece of original image data.

This can be realized by making a weighting coefficient concerning one piece of original image data to differ in accordance with each region as shown in FIG. 11, for example.

However, when the weighting coefficient is precipitously changed as shown in FIG. 11, discontinuity of an image may occur in diagnostic image data when diagnostic information is included near a weighting coefficient boundary.

Figure 12:
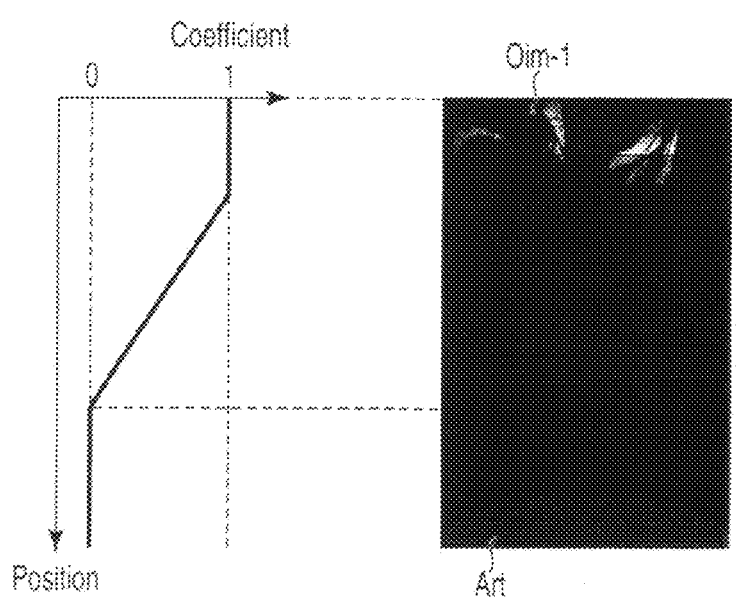
FIG. 12 is a view showing an example of setting a weighting coefficient that is used to perform combination in a state where a region where an artifact is produced is eliminated in one piece of original image data.
Figure 14:
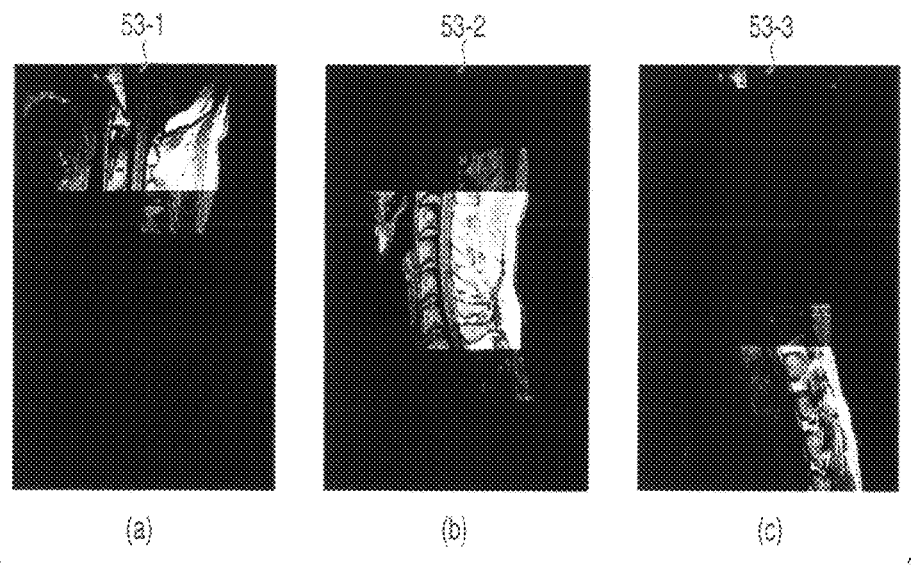
FIG. 14 is a view showing three original images obtained by using the array coil depicted in FIG. 13.
Figure 15:
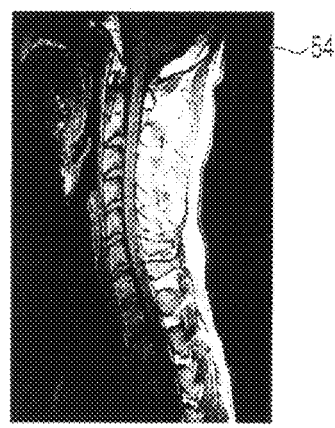
FIG. 15 is a view showing a diagnostic image obtained by combining the original images depicted in FIG. 14.

In such a case, for example, applying the weighting coefficient that gently changes as shown in FIG. 12 enables reducing discontinuity of images.

It is to be noted that, when $\Delta\gamma/2 < \Delta W/2$, an artifact may also possibly occur at not only a lower-end portion of the original image data Oim-1 but also an upper-end portion of the original image data Oim-5. In such a case, diagnostic image data in which artifacts are reduced can be likewise obtained by the same method.

That is, the original image data Oim-1 and the original image data Oim-5 may be eliminated and the remaining pieces of original image data Oim-2 to Oim-4 may be combined to generate diagnostic image data. Alternatively, the original image data Oim-1 and the original image data Oim-5 in which artifact occurrence regions alone are eliminated may be combined with the pieces of original image data Oim-2 to Oim-4 to generate diagnostic image data.

This embodiment can be further modified in many ways as follows.

Original image data to be combined to first obtain diagnostic image data may be one associated with a section specified by an operator. Further, when the operator desires diagnostic image data having less sensitivity degradation, original image data associated with a section specified by the operator may be combined with original image data associated with a section that is not specified by the operator to obtain diagnostic image data.

A section specified by the operator and a section having a predetermined relationship with respect to this section may be used to collect MR signals. For example, it can be consider that a section specified by the operator and a section adjacent to this section are used to collect MR signals.

Original image data may be reconstructed in accordance with each coil element based on an MR signal detected by each coil element.

The number of pieces of original image data or an image cross section may be arbitrary. For example, an imaging cross section may be a coronal section or an axial section.

Although the example using the array coil 33 arranged on the back side of the subject 150 has been explained, the present invention is not restricted thereto. For example, the array coil 32 arranged on the abdominal side may be used to collect original image data or diagnostic image data.

Although the example of collecting original image data or diagnostic image data by MRI to which the SE method is applied has been explained, any other pulse sequence, e.g., a fast SE (FSE) method, an echo planar imaging (EPI) method, or a gradient echo (GE) method may be applied to collect the above-explained image data.

Although the square-sum arithmetic operation method and the addition arithmetic operation method have been explained as the original image data combining method, any other combining method may be applied.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
a static magnetic field generating unit which generates a static magnetic field;
a gradient magnetic field generating unit which generates a gradient magnetic field to be superposed on the static magnetic field;
a transmitting unit which transmits a radio-frequency pulse with which an imaging region of a subject having the static magnetic field and the gradient magnetic field applied thereto is irradiated;
a plurality of coil elements which respectively receive magnetic resonance signals from the imaging region of the subject;
a collecting unit which collects the magnetic resonance signals respectively received by the plurality of coil elements or a plurality of sections formed by grouping the plurality of coil elements;
a reconstructing unit which reconstructs a plurality of pieces of first image data associated with the coil elements or the sections that have received the magnetic resonance signals, by use of the plurality of magnetic resonance signals collected by the collecting unit;
a first generating unit which determines the coil elements or the sections which have received the plurality of magnetic resonance signals which are at least some of the plurality of magnetic resonance signals collected by the collecting unit as target elements or target sections, and generates second image data by combining the plurality of pieces of first image data associated with the target elements or the target sections;
a display unit which displays an image represented by the second image data; and
a second generating unit which changes the target elements or the target sections based on specification of a change in the target elements or the target section in accordance with the specification after display of the second image by the display unit, and generates third image data by combining the plurality of pieces of first image data associated with the changed target elements or the changed target sections.

2. The magnetic resonance imaging apparatus according to claim 1, wherein the collecting unit collects the magnetic resonance signals respectively received by the coil elements or the sections specified by a user,
the first generating unit determines the specified coil elements or sections as target elements or target sections, and
the second generating unit excludes the coil elements or the sections unspecified by the user from the target elements or the target sections.

3. The magnetic resonance imaging apparatus according to claim 1, wherein the collecting unit collects the magnetic resonance signals received by the coil elements or the sections specified by the user and the coil elements or the sections having a predetermined relationship with the specified coil elements or the specified sections,
the first generating unit determines the specified coil elements or section as target elements or target sections, and
the second generating unit adds the coil elements or the sections additionally specified by the user to the target elements or the target sections.

4. The magnetic resonance imaging apparatus according to claim 1, further comprising a section forming unit which groups a plurality of coil elements aligned in a direction substantially vertical to a body axis direction of the subject from the plurality of coil elements two-dimensionally aligned along a body surface of the subject to form the plurality of sections with respect to the body axis direction.

5. The magnetic resonance imaging apparatus according to claim 1, wherein at least one of the first generating unit and the second generating unit combines the plurality of pieces of first image data based on a square-sum arithmetic operation method or an addition arithmetic operation method to generate the second image data.

6. A magnetic resonance imaging apparatus comprising:
a static magnetic field generating unit which generates a static magnetic field;
a gradient magnetic field generating unit which generates a gradient magnetic field to be superposed on the static magnetic field;
a transmitting unit which transmits a radio-frequency pulse with which an imaging region of a subject having the static magnetic field and the gradient magnetic field applied thereto is irradiated;
a plurality of coil elements which respectively receive magnetic resonance signals generated from the imaging region of the subject;
a collecting unit which collects the magnetic resonance signals respectively received by the plurality of coil elements or a plurality of sections formed by grouping the plurality of coil elements;
a reconstructing unit which reconstructs a plurality of pieces of first image data respectively associated with the coil elements or the sections that have received the magnetic resonance signals, by use of the plurality of magnetic resonance signals collected by the collecting unit;
a first generating unit which generates second image data by combining a plurality of pieces of combination target data as at least some of the plurality of pieces of first image data to generate second image data;
a display unit which displays an image represented by the second image data; and
a second generating unit which generates third image data by combining the first image data specified in accordance with specification of the first image data including an artifact from the combination target data after display of the image by the display unit with the plurality of pieces of combination target data while differentiating weighting of the plurality of pieces of combination target data excluding the specified pieces of first image data to reduce an influence of the artifact.

7. The apparatus according to claim 6, wherein the second generating unit reduces at least some of weights of the specified pieces of first image data to be smaller than weights of the plurality of pieces of combination target data excluding the specified pieces of first image data.

8. The apparatus according to claim 7, wherein the second generating unit sets at least some of weights of the specified pieces of first image data to zero.

9. The apparatus according to claim 6, further comprising a section forming unit which forms the plurality of sections with respect to the body axis direction by grouping a plurality of coil elements aligned in a direction substantially vertical to a body axis direction of the subject from the plurality of coil elements two-dimensionally aligned along a body surface of the subject.

10. The apparatus according to claim 6, wherein at least one of the first generating unit and the second generating unit combines the plurality of pieces of first image data based on a square-sum arithmetic operation method or an addition arithmetic operation method to generate the second image data.

11. An image data generating method comprising:
generating a static magnetic field;
generating a gradient magnetic field to be superposed on the static magnetic field;
transmitting a radio-frequency pulse with which an imaging region of a subject having the static magnetic field and the gradient magnetic field applied thereto is irradiated;
respectively receiving magnetic resonance signals generated from the imaging region of the subject by a plurality of coil elements;
collecting the magnetic resonance signals respectively received by the plurality of coil elements or a plurality of sections formed by grouping the plurality of coil elements;
reconstructing a plurality of pieces of first image data associated with the coil elements or the sections that have received the magnetic resonance signals, by use of the plurality of collected magnetic resonance signals;
determining the coil elements or the sections having received a plurality of magnetic resonance signals that are at least some of the plurality of collected magnetic resonance signals as target elements or target sections, and generates second image data by combining the plurality of pieces of first image data associated with the target elements or the target sections;
displaying an image represented by the second image data; and
changing the target elements or the target sections in accordance with specification of changing the target elements or the target sections when the specification is carried out after displaying the second image, and generates third image data by combining the plurality of pieces of first image data associated with the changed target elements or the changed target sections.

12. An image data generating method comprising:
generating a static magnetic field;
generating a gradient magnetic field to be superposed on the static magnetic field;
transmitting a radio-frequency pulse with which an imaging region of a subject having the static magnetic field and the gradient magnetic field applied thereto is irradiated;
respectively receiving magnetic resonance signals generated from the imaging region of the subject by a plurality of coil elements;
collecting the magnetic resonance signals respectively received by the plurality of coil elements or a plurality of sections formed by grouping the plurality of coil elements;
reconstructing a plurality of pieces of first image data associated with the coil elements or the sections that have received the magnetic resonance signals, by use of the plurality of collected magnetic resonance signals;
generating second image data by combining a plurality of pieces of combination target data as at least some of the plurality of pieces of first image data to generate second image data;
displaying an image represented by the second image data; and
generating third image data by combining specified pieces of first image data in accordance with the specification of the first image data including an artifact from the combination target data after displaying the image with the plurality of pieces of combination target data while differentiating weighting of the plurality of pieces of combination target data excluding the specified pieces of first image data to reduce an influence of the artifact.

13. A magnetic resonance imaging (MRI) system comprising:
an MRI gantry having static and gradient magnetic field generating units collectively defining, at least in part, an imaging volume therewithin;
a patient support disposed to support patient anatomy to be imaged within said imaging volume;
a plurality of RF coil elements, each RF coil element being disposed to respectively receive NMR (nuclear magnetic resonance) RF signals emanating from patient anatomy within said imaging volume but with different respective localized RF signal receiving sensitivities as a function of each coil element's spatial position with respect to the imaging volume;
an MRI control system including at least one programmed computer, a display unit and an operator input unit, said MRI control system being configured to:
(a) reconstruct and display a first set of plural MR images respectively based on NMR signals received from a corresponding first set of said RF coil elements;
(b) accept at least one operator input effectively identifying a different, partially overlapping, second set of said plural MR images or respectively corresponding RF coil elements;
(c) combine said second set of images to produce a composite image; and
(d) display said composite image.

14. An MRI system as in claim 13, wherein:
said RF coil local RF signal sensitivities overlap those of nearby other RF coils in said plurality; and
said combining of said second set of images comprises arithmetic operations based on the overlying coil RF signal sensitivities.

15. An MRI system as in claim 13, wherein said different second set of MR images omits at least part of at least one of said MR images containing image artifact caused by the corresponding RF coil element being positioned at least partly outside said imaging volume.

16. An MRI system as in claim 13, wherein said combining of said second set of images comprises arithmetic combination of image signal values using differently weighted overlapping signal values.

17. An MRI system as in claim 16, wherein at least some of the combined image signal values are weighted with a value of zero, while other weighting values are changed in a non-abrupt manner as a function of spatial position.

* * * * *